United States Patent
Yeo et al.

(10) Patent No.: US 6,843,257 B2
(45) Date of Patent: Jan. 18, 2005

(54) WAFER CLEANING SYSTEM

(75) Inventors: In-Jun Yeo, Kyunggi-do (KR);
Kyung-Hyun Kim, Seoul (KR);
Jeong-Lim Nam, Kyunggi-Do (KR);
Byoung-Moon Yoon, Kyunggi-Do (KR); Hyun-Ho Cho, Seoul (KR);
Sang-Rok Hah, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 383 days.

(21) Appl. No.: 10/133,710

(22) Filed: Apr. 25, 2002

(65) Prior Publication Data

US 2003/0200986 A1 Oct. 30, 2003

(51) Int. Cl.⁷ .................................................. C25F 5/00
(52) U.S. Cl. ............................ 134/1.3; 134/32; 134/34; 134/137; 134/140; 134/184; 134/187; 134/188; 134/198; 134/902; 438/906
(58) Field of Search ........................... 134/1.3, 32, 34, 134/137, 140, 184, 187, 188, 198, 902; 438/906

(56) References Cited

U.S. PATENT DOCUMENTS

| | | | |
|---|---|---|---|
| 4,401,131 A | * | 8/1983 | Lawson ...................... 134/149 |
| 6,039,059 A | | 3/2000 | Bran |
| 6,679,272 B2 | * | 1/2004 | Bran et al. .................. 134/1.3 |

* cited by examiner

Primary Examiner—M. Kornakov
(74) Attorney, Agent, or Firm—Marger Johnson & McCollom, P.C.

(57) ABSTRACT

Embodiments of the invention include a megasonic energy cleaning apparatus that has the ability to rotate the wafer to be cleaned, as well as rotate the cleaning probe during the cleaning process. Rotating the cleaning probe while the wafer is being cleaned is effective to increase the cleaning action of the apparatus while also minimizing damage to the wafer. Curved grooves, such as a spiral groove, can be etched into the cleaning probe to minimize forming harmful waves that could potentially cause damage to the wafer surface or to structures already made on the surface. Using a cleaning probe having a curved groove while also rotating the cleaning probe effectively cleans particles from a wafer while also limiting damage to the surface of the wafer.

38 Claims, 5 Drawing Sheets

WAFER CLEANING SYSTEM

TECHNICAL FIELD

This disclosure relates to wafer cleaning systems, and, more particularly to wafer cleaning systems that use megasonic energy to clean semiconductor wafers during manufacturing.

BACKGROUND

Semiconductor wafers and other items oftentimes require extremely high levels of cleanliness. Specifically, during the manufacture of semiconductor circuits, microscopically small particles remain on the surface of the wafer structure. Sometimes these particles are called "fallen defects", and, if not removed, can cause the circuit to operate incorrectly, or not at all. Therefore, as many of these fallen defects as possible should be removed from the semiconductor surface.

One method for cleaning fallen defects from wafers is to place wafers near a rod powered by megasonic energy, and to move the wafer underneath the rod. The megasonic energy promotes the rod to create a cleaning action, which lifts the fallen defects from the wafer surface. Megasonic energy is energy having a frequency about 10–50 times as high as Ultrasonic energy, e.g., in a range from about 200–1000 kHz. At this frequency, good cleaning properties are achieved at a power level of between about 0.01–0.10 W/mm$^2$ of the wafer surface. Additionally, chemicals such as water or other solutions can be applied to the surface of the wafer so that the solution is between the wafer and the cleaning rod during the time the cleaning rod is powered. Further, the wafer can be rotated below the powered cleaning rod to promote the cleaning action. An example of a wafer cleaning system by megasonic energy is described in U.S. Pat. No. 6,039,059 to Bran and its progeny, which are hereby incorporated by reference in their entirety.

FIG. 1 is a cross-sectional view showing an example of a wafer 10 set to be cleaned by a cleaning rod, or probe 20. A cleaning solution 12 is present on the surface of the wafer 10, and creates a meniscus in areas around the cleaning probe 20. The meniscus may be nonsymmetrical as the wafer 10 spins below the cleaning probe 20.

The cleaning probe 20 plays a key role in transmitting the high frequency energy into the cleaning solution 12 that is located between the probe and the wafer 10. When megasonic energy is applied to the cleaning probe 20, a cavitation effect is produced in the cleaning solution 12 whereby bubbles form and grow in the solution during one-half cycle of a wave and collapse in the other one-half cycle. Particles are lifted from the surface of the wafer 10 as the bubbles are produced and collapse, and are carried away by the cleaning solution 12, thereby cleaning the surface of the wafer.

One problem that occurs during the cleaning by high frequency energy is that the cleaning action can damage the wafer 10, or structures produced on the wafer, termed pattern damage. More wafer pattern damage is observed at locations directly beneath the cleaning probe 20 than in areas not beneath the probe. It is thought that damage is caused by the megasonic waves projecting directly beneath, or normal incident to the cleaning probe 20 rather than the megasonic waves projecting more transversely to the probe. When the cleaning probe 20 transmits megasonic energy into the cleaning solution 12, some energy is perpendicularly reflected from the wafer 10 surface back toward the cleaning probe 20. This reflected energy probably causes constructive interference with the additional (continuous) energy supplied by the cleaning probe 20, and/or oscillates between the cleaning probe and the wafer 10. It is believed that these megasonic interference oscillations cause the damage to the wafer 10.

Some wafer cleaning systems try to minimize this damage and increase the amount of cleaning action by spinning the wafer 10, for example between 15 and 30 revolutions per minute (RPMs), while the probe 20 is powered for megasonic cleaning. Although the amount of damage is lessened by cleaning the wafer 10 as it spins, the damage is not eliminated. Additionally, it has been found that if the wafer is spun too quickly, for example greater than 50 RPM, then the fallen particles are not effectively cleaned from the wafer 10 surface. If the wafer 10 is spun too quickly, for example greater than 50 RPM, the thickness of the cleaning solution 12 becomes so thin that adequate megasonic energy cannot be transmitted from the cleaning probe 20 to the surface of the wafer.

A distance between the cleaning probe 20 and the wafer 10 surface is also shown to have an effect on the cleaning efficiency and the amount of damage caused to the wafer. It has been determined that the most effective distance between the bottom edge surface of the cleaning probe 20 and the wafer 10 surface is approximately three-fourths of the wavelength of the megasonic energy used to excite the cleaning probe. At this distance, the cavitation effect in the cleaning solution seems to be the most efficient. Given a megasonic energy wavelength of about 900 khz, the optimum distance between the cleaning probe 20 and the wafer 10 surface is therefore approximately 1.65 mm. Distances greater than the optimum tend to not clean the wafer 10 surface very well, while distances less than the optimum tend to cause more damage to the wafer.

With these distances in mind, another idea used to more effectively clean the wafer 10 surface is to etch a pattern of transverse grooves 23 along the bottom edge surface of a cleaning probe 22, as illustrated in FIG. 2. The grooves 23 placed in the cleaning probe 22 tend to increase the overall average distance between the cleaning probe 22 and the wafer 10 surface, while maintaining the cleaning action of the areas of the wafer surface that are not directly under the probe 22. That is to say, the grooves 23 in the cleaning probe 22 play a part in reducing megasonic energy transmitted from the bottom surface of the cleaning probe 22 to the wafer 10 surface directly beneath the bottom surface of the cleaning probe, without reducing the megasonic energy transmitted from the cleaning probe 22 to areas of the wafer 10 other than directly below the probe. By having grooves 23 in the cleaning probe 22, the cleaning action is preserved while the damage to the wafer 10 surface is lessened because of the greater average distance between the wafer 10 surface directly beneath the grooved cleaning probe 22 and the cleaning probe 22 itself. However, damage can still occur at the wafer 10 surface, most likely due to the concentration of megasonic energy at the edges of the fixed grooves 23 in the cleaning probe 22.

Embodiments of the invention reduce the amount of damage caused during the cleaning of wafers, while maintaining current standards of cleanliness.

BRIEF DESCRIPTION OF THE DRAWINGS

The description may be best understood by reading the disclosure with reference to the accompanying drawings.

DETAILED DESCRIPTION

Embodiments of the invention include a megasonic energy cleaning apparatus that has the ability to rotate the wafer to be cleaned, as well as rotate the cleaning probe during a cleaning action. Rotating the cleaning probe while the wafer is being cleaned effectively increases the cleaning action of the apparatus, while also minimizing the creation of wafer pattern damage. Additionally, different curved grooves formed in the rotating cleaning probe can be used to prevent harmful waves that could potentially cause damage to the wafer surface, or to structures already made on the surface. Cleaning of the wafer according to embodiments of the invention can take place more than once during the manufacturing of a completed integrated circuit or device. For instance, the process can be used after performing a Chemical Mechanical Polishing (CMP) step, which may occur several times during the forming of a finished device.

Figure 3:
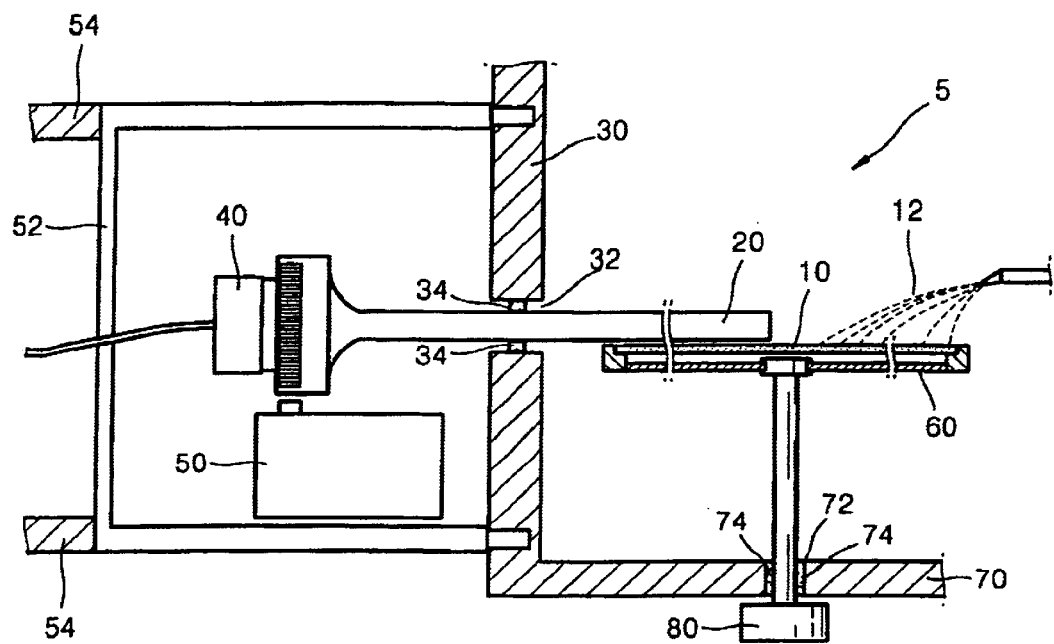
FIG. 3 is a cross-sectional view of a cleaning apparatus according to an embodiment of the invention.

FIG. 3 illustrates a megasonic energy cleaning apparatus 5 according to embodiments of the invention. The cleaning apparatus 5 includes an elongated cleaning probe 20 shaped to fit through a hole 32 in a sidewall 30 of the apparatus 5. An O-ring 34 or other seal prevents any liquid in the apparatus 5 from escaping through the sidewall 30, even when the cleaning probe 20 is vibrating at a high frequency.

A transducer 40, such as a piezoelectric transducer is acoustically and possibly otherwise coupled to an end of the cleaning probe 20, and functions to create a megasonic high frequency signal that is transmitted to the cleaning probe when the transducer is energized.

A rotating element 50, such as a motor, is coupled to the cleaning probe 20 and can cause the cleaning probe to rotate around its longitudinal, or major, axis. If the rotating element 50 is a motor, it could engage an edge of the cleaning probe 20, for example with grooves matched to a sprocket mounted on the motor, or the motor 50 spindle could be attached to a high friction "rubbery" substance that could contact the edge of a large end of the cleaning probe with enough force to cause the cleaning probe to turn. There are many ways to cause the cleaning probe 20 to rotate, and the mechanism of rotating the probe is not as important as its ability to do so. The motor 50 can be structured to cause the cleaning probe 20 to rotate at a single speed in a single direction, or can be structured to cause the cleaning probe to rotate at a variety of different speeds, in both directions.

A probe support 52 is coupled to the cleaning apparatus 5, and can be used to provide a second support for the cleaning probe 20, in addition to the hole 32 in the sidewall 30, either by supporting the motor 50 (which in turn supports the cleaning probe) or by supporting the cleaning probe directly. Additionally, the probe support 52 can be mounted on a platform moving structure, such as the threaded rods 54. These threaded rods 54, when turned, engage a threaded surface (not shown) within the probe support 52, which allows the probe support to move the cleaning probe 20 into and out of the apparatus. The platform moving structure 54 is able to move the cleaning probe 20 even as it is being rotated by the motor 50. Further, the platform moving structure may take any form, and the threaded rods 54 shown in FIG. 3 are only one way to move the structure. Other methods are known to those having skill in the art.

A wafer support 60 is mounted in the apparatus 5 to support the wafer 10 to be cleaned. The wafer 10, when mounted in the support 60, is positioned sufficiently close to the cleaning probe 20 so that the agitation of the cleaning solution 12 between the probe and the wafer can loosen particles on the surface of the wafer. When in position for cleaning, the distance between the cleaning probe 20 and the surface of the wafer 10 is preferably less than about 0.1 of an inch.

The support 60 projects through a hole 72 in a bottom surface 70 of the cleaning apparatus 5. An O-ring 74 or other type seal prevents any liquid from within the cleaning apparatus 5 to escape through the hole 72. The support 60 is coupled to a turning apparatus or motor 80, which can spin the support (and thus the wafer placed on the support) during the cleaning process.

Although illustrated in FIG. 3 as having the cleaning probe 20 extend about halfway across the surface of the wafer 10 to be cleaned, while the wafer spins so that the entire surface comes into contact with the cleaning probe, other methods of causing the wafer and the cleaning probe to be in near contact are possible. For instance, the cleaning probe could extend all of the way across the wafer 10, and the wafer would only need one-half rotation for the entire surface of the wafer to be near the cleaning probe, rather than the full rotation as described above. Or, the cleaning probe 20 may move laterally in relation to the wafer 10, either by moving the wafer or by moving the cleaning probe itself by moving the probe support 52.

During cleaning, the transducer 40 that is coupled to the cleaning probe 20 is electrically excited, which causes the probe 20 to vibrate. If the transducer is piezoelectric, excitation energy controls the vibration. The wafer 10 is loaded into position on the support 60, and the cleaning solution 12 is applied to a surface thereof. When the cleaning probe 20 is near the wafer 10 to be cleaned, megasonic energy is applied to the cleaning probe, which agitates the cleaning solution 12 and causes cavitation of the cleaning solution. Cavitation is increased as the power of the megasonic energy is increased. Thus, the more power induced, the higher the effectiveness of the cleaning of the wafer surface. However, increased power also increases the number of damaged areas on the surface of the wafer 10 to be cleaned.

As the wafer 10 is being cleaned, the fallen particles are picked up or "lifted" from the wafer surface into the cleaning solution 12. The cleaning solution 12 that contains the lifted particles can be replaced by a rinse cycle whereby the dirty fluid is washed away, a constant flushing of the wafer 10 surface with new cleaning solution, or by some other method to replace the cleaning solution containing the lifted fallen particles with fresh cleaning solution that is not contaminated.

Figure 4:
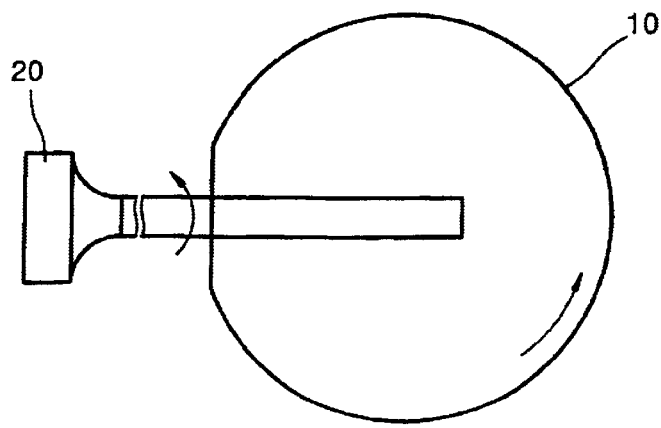
FIG. 4 is a top view of a wafer to be cleaned and a cleaning probe according to embodiments of the invention.

FIG. 4 is a top view diagram that shows the relative movement of the wafer 10, which is rotated through the support 60 by the motor 80 (FIG. 3), and the cleaning probe 20, which is rotated by the rotator 50 (FIG. 3) during a wafer cleaning operation. If it is assumed that the wafer 10 spins in a counter-clockwise direction, then the cleaning probe 20 is also spun counter-clockwise, when viewed along the longitudinal axis of the probe from the end that is away from the wafer. In other words, as viewed in FIG. 4, the cleaning probe 20 is spinning from the right hand side of the probe, over the top, and down the left hand side of the probe, as the edge of the wafer 10 nearest the probe is spinning from left to right.

Figure 1:
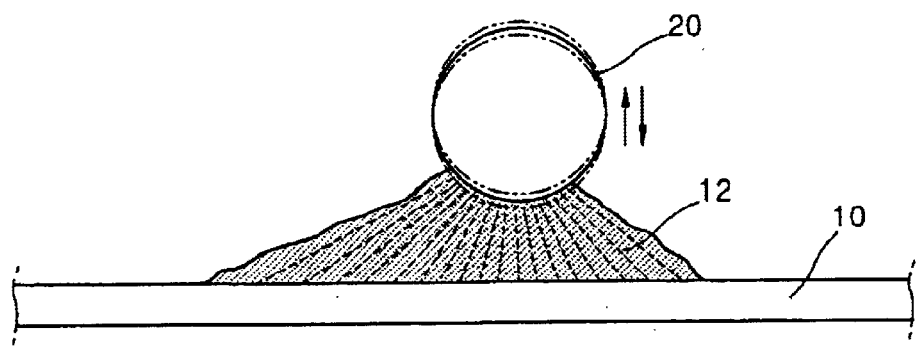
FIG. 1 is a cross-sectional view of a wafer positioned to be cleaned by a cleaning probe.
Figure 2:
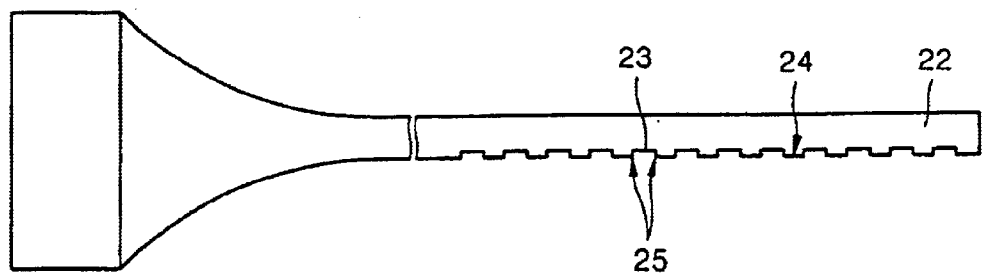
FIG. 2 is a side view of a grooved cleaning probe according to the prior art.

In addition to operating the cleaning probe 20 by rotating it, the cleaning action of the cleaning probe can be enhanced by etching or grooving the probe to enhance its cleaning action. The groove 23 can be styled to minimizing any possible wafer pattern damage. A source of wafer pattern damage, mentioned above, occurs when waves are created in the cleaning solution 12 due to the edges 25 of grooves 23 formed in a bottom surface of the powered cleaning probe 20, as shown in FIG. 2.

Figure 5:
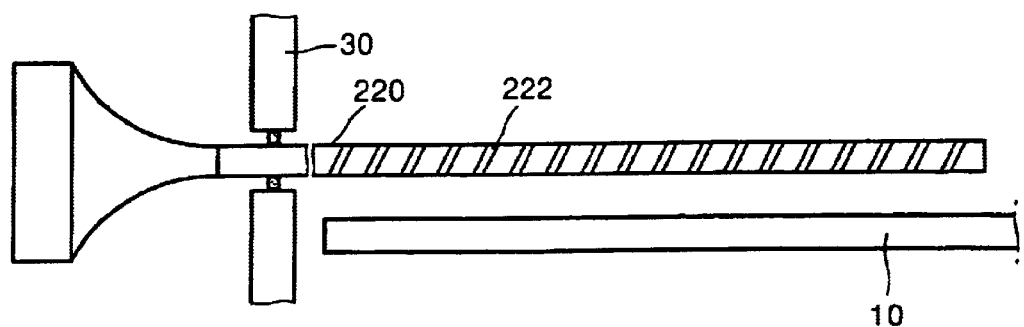
FIG. 5 is a side view of a cleaning probe according to an embodiment of the invention.

A groove formed to minimize any wave patterns in the cleaning solution 12 is illustrated in FIG. 5. In that figure a cleaning probe 220 includes a generally curving groove 222 formed along the longitudinal, or major axis of the probe. The groove 222 may be a spiraling groove, or may be another pattern. One advantage of having a spiraling groove 222 in the cleaning probe 220 is that it can create more cleaning action than a non-grooved cleaning probe and, when used in conjunction with a probe rotator 50 (FIG. 3), better distributes and disperses the megasonic energy transmitted from the edge of the groove to the surface of the wafer 10 directly below the probe, thereby minimizing damage to the wafer. The cleaning probe 220 of FIG. 5 can be used in the cleaning apparatus 5 of FIG. 3 without modification to either the probe or the apparatus.

As mentioned above, as the cleaning wafer 10 rotates underneath the cleaning probe 220, the probe can also rotate. During the cleaning process, the cleaning probe 220 rotates about its major axis and, because of the curved groove 222, the megasonic energy imparted to the cleaning solution 12 by the probe does not concentrate at any specific region of the wafer 10 or in the cleaning solution. By rotating the cleaning probe 220, energy that is emitted from the edge of the groove, is dispersed through the cleaning solution 12 on the entire surface of the wafer 10. Thus, any damage that may be caused by the megasonic waves that are projected directly beneath the probe 220 is remarkably reduced.

As shown in FIG. 5, in a preferred embodiment, when the cleaning probe 220 is in its cleaning (extended) position, the groove 222 extends along the cleaning probe 222 from its tip to an area just above the edge of the wafer 10 to be cleaned. In any event, it is preferable that the groove 222 not extend beyond the sidewall 30 of the cleaning apparatus 5, otherwise liquid may escape from the interior of the apparatus through the hole 32, by flowing out the groove 222 of the cleaning probe 220.

Figure 6A:
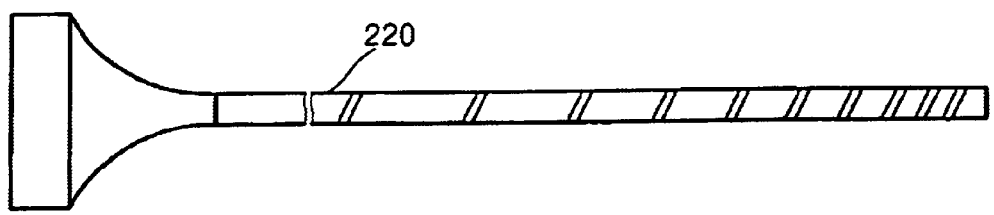
FIGS. 6A and 6B are side views of cleaning probes according to different embodiments of the invention.
Figure 6B:
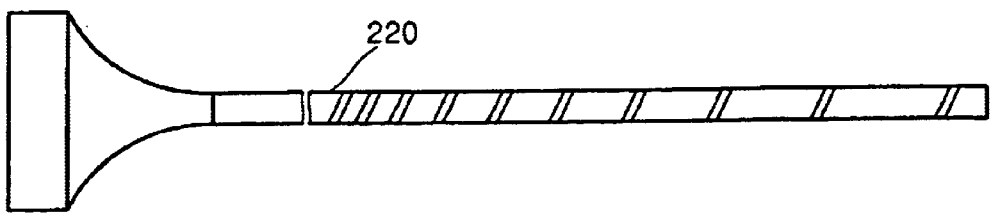
Figure 7A:
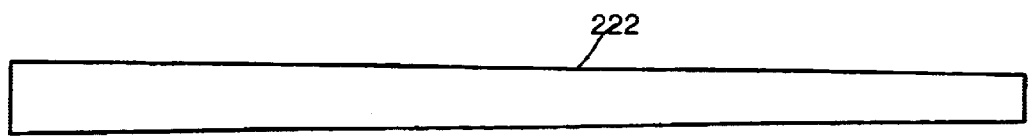
FIGS. 7A and 7B are illustrations of example groove shapes according to embodiments of the invention.
Figure 7B:

Additionally, as shown in FIGS. 6A and 6B, the spiral groove 222 may have a non-continuous thread pitch, where there are more grooves per unit length in a portion of the cleaning probe 220 near the elongated end (FIG. 6A) or more grooves per unit length near the end where the acoustic energy is applied (FIG. 6B). Having non-uniform thread pitch may be beneficial to more evenly distribute the acoustical energy from the cleaning probe 220 into the cleaning solution 12. Further, the width of the groove 222 need not be the same throughout the length of the groove. For example, as shown in FIG. 7A, which is a view of the curved groove 222 as if it were stretched out in a straight line, the groove may be wider at one end than the other. Or yet still, the groove 222 could have a constantly varying width, as shown in FIG. 7B, or the groove 222 could be shaped using a combination of the widths shown in FIGS. 7A and 7B, or others.

Figure 8A:
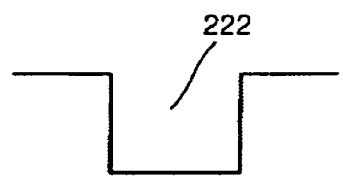
FIGS. 8A–8F are illustrations of example groove cross sectional shapes according to embodiments of the invention.
Figure 8B:
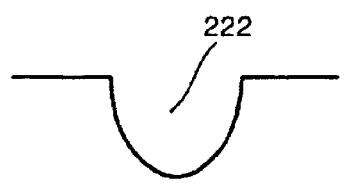
Figure 8C:
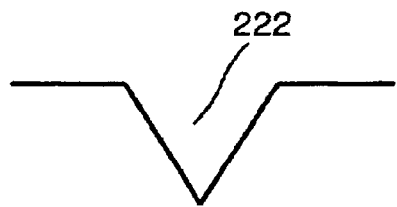
Figure 8D:
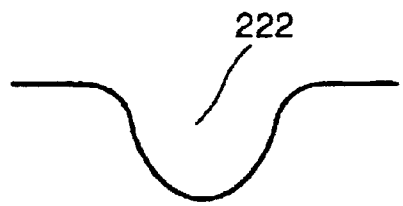
Figure 8E:
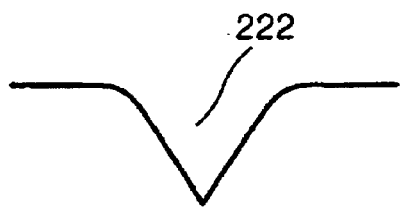
Figure 8F:
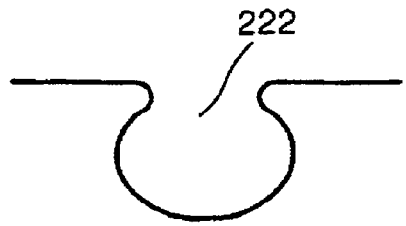

The shape of the groove 222 itself may also have an effect on the cleaning ability of the cleaning probe 220. As shown in FIG. 8A the groove 222 may have a standard groove shape, with a relatively planer bottom, and two relatively straight sidewalls, perpendicular to the bottom. Or, the groove 222 may be "U" or "V" shaped, as respectively shown in FIGS. 8B and 8C. Because strong edges of the groove 222 may increase its propensity to cause damage to the wafer 10, the FIGS. 8D and 8E show "U" and "V" shaped grooves having rounded edges, which could also be used for the groove. Additionally, there is no limitation that edges of the groove 222 necessarily have to be as wide as or wider than the groove itself. Thus, the groove 222 may be shaped as shown in FIG. 8F, with rounded groove edges that are closer together than the bottom area of the groove. Although several examples of groove shape are shown in FIGS. 8A–8F, the invention itself is not limited to any particular shape, and could in fact be any of the shown shapes, or others, or combinations thereof.

Although not mentioned above, the direction in which the spiral grove 222 turns may have an effect on the cleaning action or the minimization of wafer pattern damage. Thus, the groove 222 can be created in the cleaning probe 220 having turns in either direction, i.e., either the groove pattern rotates the same way that the probe 220 itself turns in the cleaning apparatus 5, or the groove 222 can be created so that it turns in the opposite direction. Of course, because the motor 80 is generally structured to spin the wafer 10 in a single direction, and because the cleaning probe 220 also generally spins in the same direction as the wafer, two probes must be available, each having a groove 222 with a different turning direction.

Generally, the cleaning probe 220 is made of quartz, which is unaffected by most cleaning solutions 12, but the probe could be made of other materials as well. For example, the cleaning probe 220 may be made of sapphire silicon carbide, boron nitride, vitreous carbon, glassy carbon coated graphite, other suitable materials, or a combination of these materials, with or without quartz.

Implementation of the cleaning apparatus 5 and the cleaning probe 220 is straightforward in light of the above disclosure. As always, implementation details are left to the system designer. For instance, the ratio of turns of the cleaning probe 220 to the turns of the wafer 10 may be best determined empirically. Additionally, the best pitch, pitches, groove shape or shapes, and width of the groove, along with other details of the cleaning probe 220 can be modified and maximized, and still fall within the scope of the invention.

Thus, although particular embodiments for a cleaning apparatus including a cleaning probe that is able to be rotated, and a grooved cleaning probe itself have been discussed, it is not intended that such specific references be considered as limitations upon the scope of this invention, but rather the scope is determined by the following claims and their equivalents.

What is claimed is:

1. A megasonic wafer cleaning system, comprising:
   a cleaning vessel;
   a wafer support located in the cleaning vessel and structured to hold a wafer to be cleaned,
   a wafer rotator coupled to the wafer support configured to cause such wafer to be cleaned to be rotated;
   a probe rotator;

a probe vibrator structured to produce megasonic vibrations; and a cleaning probe having a coupling end and an elongated end, the coupling end of the probe coupled to the probe rotator and to the probe vibrator, and the elongated end of the probe adapted to be proximal to the wafer to be cleaned, at least a portion of the elongated end of the cleaning probe having a curvilinear groove formed therein.

2. The wafer cleaning system of claim 1 wherein the groove in the cleaning probe is spiraled along a longitudinal axis of the cleaning probe.

3. The wafer cleaning system of claim 1 wherein the cleaning vessel has an aperture formed therein, the system further comprising a probe mount attached to a surface of the cleaning vessel, the probe mount structured to support the cleaning probe capable of being inserted through the aperture in the cleaning vessel.

4. The wafer cleaning system of claim 3 wherein the probe mount is directly coupled to the probe rotator.

5. The wafer cleaning system of claim 3 wherein the probe mount is structured to cause the cleaning probe to be slidably inserted through the aperture in the cleaning vessel, and, when the cleaning probe is fully inserted into the aperture of the cleaning vessel, the curvilinear groove in the cleaning probe extends from a tip of the elongated end of the cleaning probe to an area of the cleaning probe substantially adjacent to an edge of a wafer inserted in the wafer support.

6. The wafer cleaning system of claim 2 wherein a pitch of the spiral groove changes along the length of the cleaning probe.

7. The wafer cleaning system of claim 6 wherein the spiral groove has a first end toward the coupling end of the cleaning probe and has a second end toward the elongated end of the cleaning probe, and wherein the pitch of the spiral groove is less steep at the first end than at the second end.

8. The wafer cleaning system of claim 1 wherein the probe rotator is a motor.

9. The wafer cleaning system of claim 1 wherein the groove formed in the cleaning probe has a U-shaped cross section.

10. The wafer cleaning system of claim 1 wherein the groove formed in the cleaning probe has a flanged U-shaped cross section.

11. The wafer cleaning system of claim 1 wherein the groove formed in the cleaning probe has a V-shaped cross section.

12. The wafer cleaning system of claim 1 wherein the groove formed in the cleaning probe has a flanged V-shaped cross section.

13. The wafer cleaning system of claim 1 wherein the groove formed in the cleaning probe has a relatively flat bottom surface, and has two relatively flat sides formed perpendicular to the bottom surface.

14. The wafer cleaning system of claim 1 wherein the groove formed in the cleaning probe has a first edge and a second edge, and wherein a distance between the first edge and the second edge is less than a distance across a widest portion of the groove.

15. The wafer cleaning system of claim 1 wherein the probe rotator is structured to rotate the cleaning probe while the wafer rotator is rotating the wafer to be cleaned.

16. The wafer cleaning system of claim 15 wherein a rotation speed of the cleaning probe is independent of a rotation speed of the wafer to be cleaned.

17. The wafer cleaning system of claim 15 wherein the probe rotator is structured to rotate the cleaning probe in either a forward or a reverse direction in relation to a rotation direction of the wafer to be cleaned.

18. The wafer cleaning system of claim 1 wherein the groove formed in the cleaning probe has more than one width.

19. The wafer cleaning system of claim 18 wherein the groove formed in the cleaning probe has a first end toward the coupling end of the cleaning probe and has a second end toward the elongated end of the cleaning probe, and wherein the groove formed in the cleaning probe has a width that is greater at the first end than it is at the second end.

20. In an apparatus for cleaning a semiconductor wafer including a cleaning chamber, a wafer support in the cleaning chamber, a probe rotator, and a probe vibrator, a cleaning probe adapted to be coupled to the probe vibrator and to the probe rotator, the cleaning probe comprising:

a generally elongated rod having a first end for receiving energy and having an elongated end for producing cleaning action, at least a portion of the elongated end of the cleaning probe having a spiral groove formed therein.

21. The cleaning probe of claim 20 wherein the spiral groove in the cleaning probe is spiraled along a longitudinal axis of the cleaning probe.

22. The cleaning probe of claim 20 wherein a pitch of the spiral groove changes along the length of the cleaning probe.

23. The cleaning probe of claim 20 wherein the spiral groove has a first end toward the first end of the cleaning probe and has a second end toward the elongated end of the cleaning probe, and wherein the pitch of the spiral groove is less steep at the first end than at the second end.

24. The cleaning probe of claim 20 wherein the groove formed in the cleaning probe has a U-shaped cross section.

25. The cleaning probe of claim 20 wherein the groove formed in the cleaning probe has a flanged U-shaped cross section.

26. The cleaning probe of claim 20 wherein the groove formed in the cleaning probe has a V-shaped cross section.

27. The cleaning probe of claim 20 wherein the groove formed in the cleaning probe has a flanged V-shaped cross section.

28. The cleaning probe of claim 20 wherein the groove formed in the cleaning probe has a relatively flat bottom surface, and has two relatively flat sides formed perpendicular to the bottom surface.

29. The cleaning probe of claim 20 wherein the groove formed in the cleaning probe has a first edge and a second edge, and wherein a distance between the first edge and a second edge is less than a distance across the widest portion of the groove.

30. The cleaning probe of claim 20 wherein the groove formed in the cleaning probe has more than one width.

31. The cleaning probe of claim 20 wherein the groove in the cleaning probe has a first end toward the first end of the cleaning probe and has a second end toward the elongated end of the cleaning probe, and wherein the groove formed in the cleaning probe has a width that is greater at the first end than it is at the second end.

32. A method for cleaning a wafer, comprising:

mounting the wafer to be cleaned in a rotatable mount;

applying a liquid to a surface of the wafer to be cleaned;

rotating the mounted wafer;

placing a cleaning probe proximate to the rotating mounted wafer;

applying megasonic energy to the cleaning probe;

rotating the cleaning probe at the same time the mounted wafer is rotating.

33. The method of claim 32 wherein placing a cleaning probe proximate to the rotating mounted wafer comprises placing a cleaning probe having a curvilinear groove formed therein proximate to the rotating mounted wafer.

34. The method of claim 33 wherein placing a cleaning probe having a curvilinear groove formed therein proximate to the rotating mounted wafer comprises placing a cleaning probe having a spiral groove formed therein proximate to the rotating mounted wafer.

35. The method of claim 34 wherein the spiral groove has a non-uniform pitch.

36. The method of claim 35 wherein the megasonic energy is applied to a first end of the cleaning probe, and wherein the pitch of the spiral groove is less steep toward the first end than at other areas of the cleaning probe.

37. The method of claim 32 wherein placing a cleaning probe proximate to the rotating mounted wafer occurs after rotating the cleaning probe at the same time the mounted wafer is rotating.

38. The method of claim 32 wherein placing a cleaning probe proximate to the rotating mounted wafer occurs after applying megasonic energy to the cleaning probe.

* * * * *